United States Patent
Mauri et al.

(10) Patent No.: US 8,305,715 B2
(45) Date of Patent: Nov. 6, 2012

(54) MAGNETORESISTANCE (MR) READ ELEMENTS HAVING AN ACTIVE SHIELD

(75) Inventors: Daniele Mauri, San Jose, CA (US); Neil Smith, San Jose, CA (US)

(73) Assignee: HGST Netherlands, B.V., Amsterdam (NL)

( * ) Notice: Subject to any disclaimer, the term of this patent is extended or adjusted under 35 U.S.C. 154(b) by 1273 days.

(21) Appl. No.: 11/965,532

(22) Filed: Dec. 27, 2007

(65) Prior Publication Data

US 2009/0168256 A1 Jul. 2, 2009

(51) Int. Cl.
*G11B 5/39* (2006.01)
(52) U.S. Cl. .......................... 360/319; 360/313
(58) Field of Classification Search .................. 360/319, 360/313
See application file for complete search history.

(56) References Cited

U.S. PATENT DOCUMENTS

| | | | |
|---|---|---|---|
| 5,696,565 A | 12/1997 | Gill et al. | |
| 5,898,548 A | 4/1999 | Dill et al. | |
| 6,025,977 A | 2/2000 | Hu et al. | |
| 6,125,009 A | 9/2000 | Ishiwata et al. | |
| 6,496,335 B2 | 12/2002 | Gill | |
| 6,943,993 B2 | 9/2005 | Chang et al. | |
| 6,947,264 B2 * | 9/2005 | Gill | 360/324.2 |
| 7,023,671 B2 * | 4/2006 | Gill | 360/324.12 |
| 7,046,487 B2 | 5/2006 | Terunuma | |
| 7,085,109 B1 | 8/2006 | Ishiwata | |
| 7,152,305 B2 | 12/2006 | Werner | |
| 7,848,061 B2 * | 12/2010 | Jayasekara et al. | 360/319 |
| 2005/0047027 A1 * | 3/2005 | Lin | 360/324.1 |
| 2005/0207070 A1 * | 9/2005 | Carey et al. | 360/324.1 |
| 2005/0213258 A1 * | 9/2005 | Gill | 360/314 |
| 2006/0018055 A1 | 1/2006 | Haginoya et al. | |
| 2006/0077591 A1 | 4/2006 | Kurihara et al. | |
| 2006/0256482 A1 | 11/2006 | Araki et al. | |
| 2007/0025026 A1 | 2/2007 | Hosseinali et al. | |
| 2007/0030603 A1 * | 2/2007 | Sato et al. | 360/324 |
| 2007/0201166 A1 * | 8/2007 | Gill | 360/319 |
| 2009/0135529 A1 * | 5/2009 | Shimazawa et al. | 360/319 |

OTHER PUBLICATIONS

Haginoya et al., "Side-shielded tunneling magnetoresistive read head for high-density recording", IEEE Transactions on Magnetics, vol. 40, No. 4, pt 2, p. 2221-2223 (Jul. 2004).
Mao, Sining, "Structure and performance of TGMR heads for next-generation HDDs", Solid State Technology, vol. 47, No. SUPPL (Sep. 2004).

* cited by examiner

*Primary Examiner* — Julie Anne Watko
*Assistant Examiner* — Carlos E Garcia
(74) *Attorney, Agent, or Firm* — Duft Bornsen & Fishman, LLP

(57) ABSTRACT

Read elements and associated methods of fabrication are disclosed. A read element as described herein includes a magnetoresistance (MR) sensor sandwiched between first and second shields. The read element uses the first shield as an active portion of the MR sensor. Instead of implementing an AFM pinning layer in the MR sensor, the first shield takes the place of the AFM pinning layer. The first shield is orthogonally coupled to the pinned layer through an orthogonal coupling layer, such as a thin layer of AFM material. Through this structure, the magnetic moment of the first shield pins the magnetic moment of the pinned layer transverse to the ABS of the read element, and an AFM pinning layer is not needed.

14 Claims, 4 Drawing Sheets

MAGNETORESISTANCE (MR) READ ELEMENTS HAVING AN ACTIVE SHIELD

BACKGROUND OF THE INVENTION

1. Field of the Invention

The invention is related to the field of magnetoresistance (MR) read elements and, in particular, to MR read elements where one of the shields sandwiching an MR sensor forms an active portion of the MR sensor.

2. Statement of the Problem

Many computer systems use magnetic disk drives for mass storage of information. Magnetic disk drives typically include one or more recording heads (sometimes referred to as sliders) that include read elements and write elements. An actuator/suspension arm holds the recording head above a magnetic disk. When the magnetic disk rotates, an air flow generated by the rotation of the magnetic disk causes an air bearing surface (ABS) side of the recording head to fly a particular height above the magnetic disk. The height to which the recording head flies depends on the shape of the ABS. As the recording head rides on the air bearing, an actuator moves the actuator/suspension arm to position the read element and the write element over selected tracks of the magnetic disk.

To read data from the magnetic disk, transitions on a track of the magnetic disk emit magnetic fields. As the read element passes over the transitions, the magnetic fields of the transitions modulate the resistance of the read element. The change in resistance of the read element is detected by passing a sense current through the read element, and then measuring the change in bias voltage across the read element to generate a read signal. The resulting read signal is used to recover the data encoded on the track of the magnetic disk.

One type of read element uses magnetoresistance (MR) sensors to sense the transitions on the magnetic disk. The read element may use Giant MR (GMR) sensors, Tunneling MR (TMR) sensors, or other types of MR sensors. The basic structure of a read element includes an MR sensor (or MR sensor stack) sandwiched between two shields. The MR sensor is formed from a plurality of thin-films. The thin-films include an antiferromagnetic (AFM) pinning layer (e.g., PtMn), a ferromagnetic pinned layer (e.g., CoFe), a nonmagnetic spacer layer (e.g., Cu), and a ferromagnetic free layer (e.g., CoFe). The AFM pinning layer has a fixed magnetization that in turn fixes the magnetic moment of the pinned layer perpendicular (transverse) to the ABS of the read element. The pinned layer may be comprised of a single layer, or may have a synthetic antiferromagnetic (SAF) pinned structure. An SAF pinned structure includes a first ferromagnetic pinned (keeper) layer (e.g., CoFe), an antiparallel coupling layer (e.g., Ru), and a second ferromagnetic pinned (reference) layer (e.g., CoFe). The first pinned (keeper) layer has a magnetization oriented in a first direction perpendicular to the ABS by exchange coupling with the AFM pinning layer. The second pinned (reference) layer is antiparallel coupled with the first pinned (keeper) layer across the antiparallel coupling layer. Accordingly, the magnetization of the second pinned (reference) layer is oriented in a second direction that is antiparallel to the direction of the magnetization of the first pinned (keeper) layer.

When a read element is performing a read operation, the ABS of the MR sensor is positioned adjacent to a desired track on the magnetic disk. A transition on the magnetic disk will pass under the first shield, under the MR sensor, and then under the second shield. When the transition passes under the MR sensor, the magnetic fields of the transition will rotate the magnetic moment of the free layer, which in turn changes the resistance of the MR sensor. The change in resistance of the MR sensor is detected by the sense current that is passed through the MR sensor. The transitions sensed by the sense current thus provide the read signal representing the data written to the magnetic disk.

The purpose of the shields formed on either end of the MR sensor is to absorb magnetic fields emitted from neighboring transitions along the track during the read operation. The MR sensor thus only "sees" the magnetic fields from the transition which is presently underneath the MR sensor and not the magnetic fields from the neighboring transitions. If the read element is used in a current perpendicular to plane (CPP) fashion, then the shields may also be used as current leads for the sense current, as the current is injected from one shield, through the MR sensor (perpendicular to the major planes), and through the other shield. Two main types of CPP MR sensors can be distinguished, one is fully metallic and based on the GMR effect, the other contains an insulating barrier and is based on the tunneling magnetoresistance (TMR) effect.

As densities of the magnetic disk increase beyond 500 $Gb/in^2$, the spacing between the shields needs to be lower than about 300 nanometers. To get spacing this low, the total thickness (i.e., the distance between the shields) of the MR sensor needs to be lower than 300 Å. It is presently a problem to fabricate a metallic CPP MR sensor having a thickness less than 300 Å while still providing an adequate read signal. Large MR sensor thicknesses provide optimal read signal performance, but at the same time the large MR sensor thicknesses do not allow for higher density recording. TMR based CPP sensors can more easily fit inside a 300 Å shield-to-shield spacing, but can present a similar problem at smaller spacing (i.e. higher linear densities).

SUMMARY OF THE INVENTION

Embodiments of the invention have a read element that uses one of the shields as an active portion of the MR sensor. Instead of implementing an AFM pinning layer in the MR sensor, one of the shields takes the place of the AFM pinning layer. The shield is orthogonally coupled to the pinned layer through an orthogonal coupling layer, such as a thin layer (i.e., 20 Å) of AFM material. Through this structure, the magnetic moment of the shield pins the magnetic moment of the pinned layer transverse to the ABS of the read element, and an AFM pinning layer is not needed.

A typical AFM pinning layer may have a thickness of 60 Å or more, in addition to one or more seed layers that may be deposited along with the AFM pinning layer. By removing the AFM pinning layer from the MR sensor and using the shield as an active portion, the overall thickness of the MR sensor may be reduced. The read element as described herein may advantageously be used for higher density recording due to the lower thickness of the MR sensor. Also, the AFM pinning layer has a high parasitic resistance, so removal of the AFM pinning layer allows for improved signal-to-noise ratio (SNR).

One embodiment of the invention comprises a read element that uses a first shield as an active portion of the MR sensor. The MR sensor of the read element is formed on the first shield, and includes an orthogonal coupling layer on the first shield, with a first pinned layer on the orthogonal coupling layer. The first pinned layer has a magnetic moment that is orthogonally coupled to a magnetic moment of the first shield across the orthogonal coupling layer. The MR sensor further includes an AP coupling layer on the first pinned layer, and a second pinned layer on the AP coupling layer. The second pinned layer has a magnetic moment that is antiparallel coupled to the magnetic moment of the first pinned layer across the AP coupling layer. The MR sensor further includes a spacer layer on the second pinned layer, and a free layer on the spacer layer.

In this embodiment, the first shield acts as the pinning layer for the read element. As a result, the MR sensor does not need an AFM pinning layer as in a convention read element, which provides the advantages described above.

The invention may include other exemplary embodiments described below.

DESCRIPTION OF THE DRAWINGS

The same reference number represents the same element or same type of element on all drawings.

DETAILED DESCRIPTION OF THE INVENTION

FIGS. 1-7 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
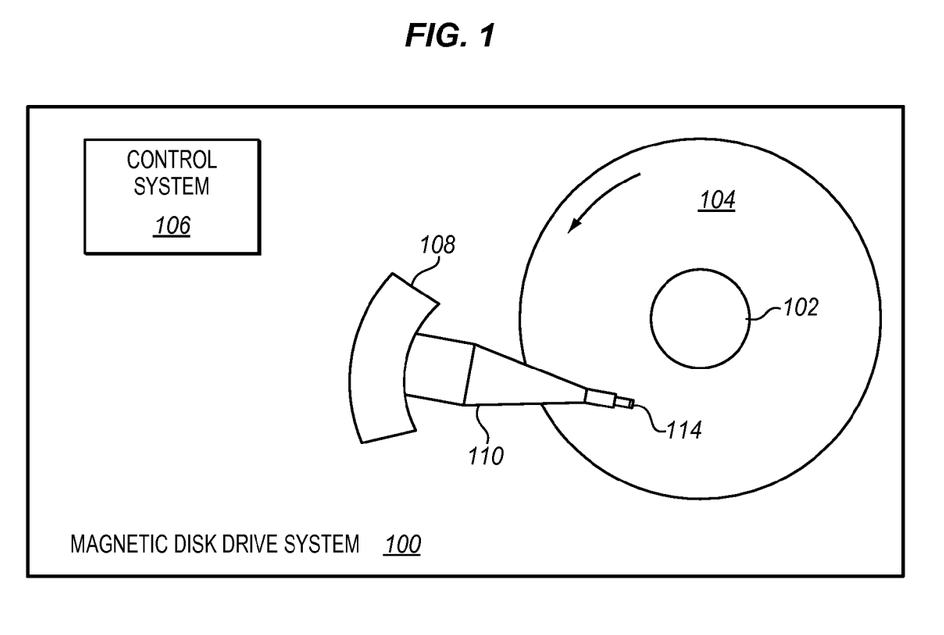
FIG. 1 illustrates a magnetic disk drive system.

FIG. 1 illustrates a magnetic disk drive system 100. Magnetic disk drive system 100 includes a spindle 102, a magnetic disk 104, a control system 106, an actuator 108, an actuator/suspension arm 110, and a recording head 114. Spindle 102 supports and rotates magnetic disk 104 in the direction indicated by the arrow. A spindle motor (not shown) rotates spindle 102 according to control signals from control system 106. Recording head 114 is supported by actuator/suspension arm 110, and actuator/suspension arm 110 is connected to actuator 108 that is configured to rotate in order to position recording head 114 over a desired track of magnetic disk 104. Magnetic disk drive system 100 may include other devices, components, or systems not shown in FIG. 1. For instance, a plurality of magnetic disks, actuators, actuator/suspension arms, and recording heads may be used.

When magnetic disk 104 rotates, an air flow generated by the rotation of magnetic disk 104 causes an air bearing surface (ABS) of recording head 114 to fly on a cushion of air at a particular height above magnetic disk 104. The height depends on the shape of the ABS. As recording head 114 flies over the surface of magnetic disk 104, actuator 108 moves actuator/suspension arm 110 to position a read element (not shown) and a write element (not shown) in recording head 114 over selected tracks of magnetic disk 104.

Figure 2:
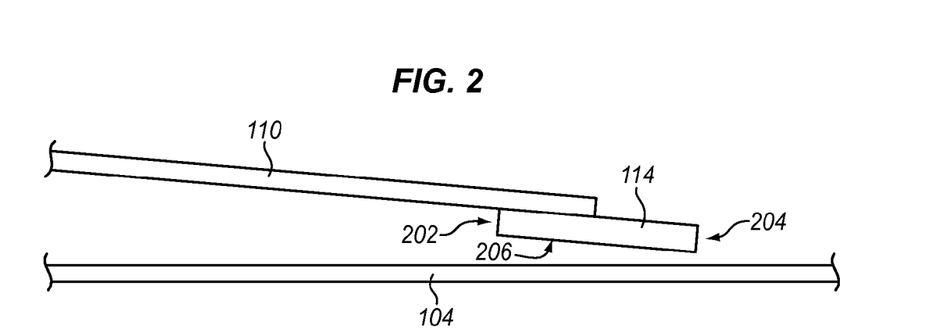
FIG. 2 is a side view of a magnetic disk drive system.

FIG. 2 is a side view of magnetic disk drive system 100. Recording head 114 is supported above the surface of magnetic disk 104 by actuator/suspension arm 110. Recording head 114 includes a front end 202 and an opposing trailing end 204. Recording head 114 also includes an air bearing surface 206 that faces toward the surface of magnetic disk 104. A read element (not shown) and a write element (not shown) are formed proximate to the trailing end 204, which is further illustrated in FIG. 3.

Figure 3:
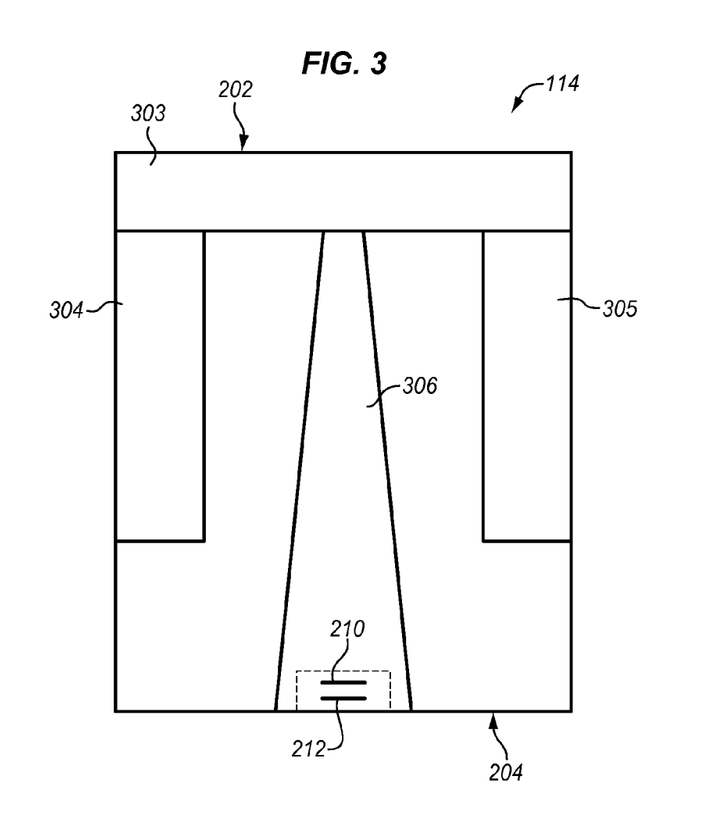
FIG. 3 is an ABS view of a recording head.

FIG. 3 is an ABS view of recording head 114. The ABS 206 of recording head 114 is the surface of the page in FIG. 3. Recording head 114 has a cross rail 303, two side rails 304-305, and a center rail 306 on the ABS 206 which define how recording head 114 flies over the surface of magnetic disk 104. The rails on recording head 114 illustrate just one embodiment, and the configuration of the ABS 206 of recording head 114 may take on any desired form. Recording head 114 also includes a write element 210 and a magnetoresistance (MR) read element 212 fabricated proximate to trailing end 204.

Figure 4:
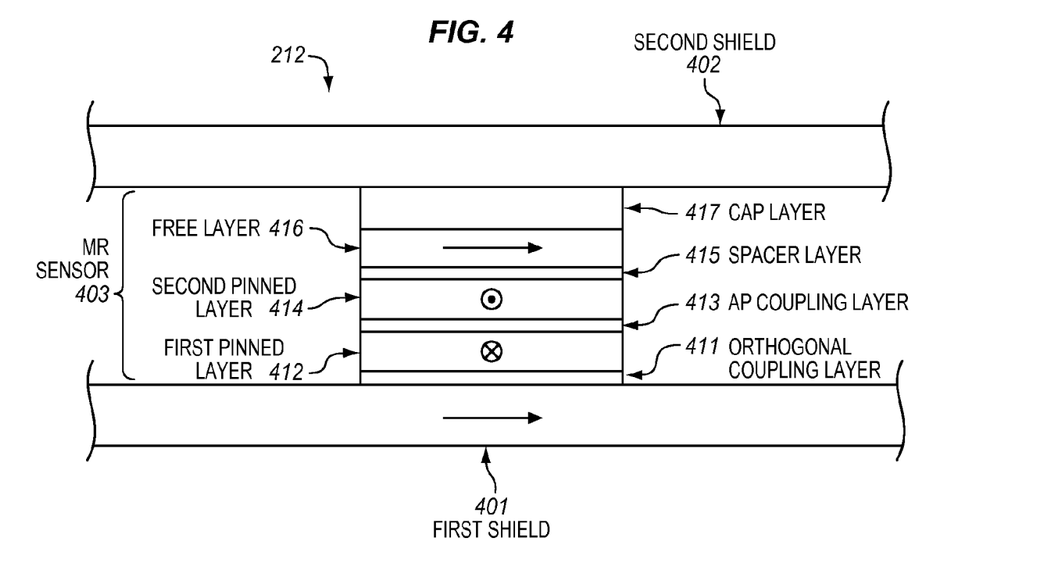
FIG. 4 illustrates a read element in an exemplary embodiment of the invention.

FIG. 4 illustrates a read element 212 in an exemplary embodiment of the invention. FIG. 4 is a view from the ABS of read element 212, meaning that the ABS is the surface of the page of FIG. 4. Read element 212 includes a first shield 401 and a second shield 402 that sandwich an MR sensor 403. MR sensor 403 is comprised of a plurality of thin-films that form the layers 411-417 of MR sensor 403. The layers 411-417 shown for MR sensor 403 illustrate just one embodiment, and MR sensor 403 may include additional layers or different layers in other embodiments. Although MR sensor 403 comprises a GMR sensor in this embodiment, the concepts described below may be extended to other types of MR sensors, such as TMR sensors.

MR sensor 403 includes an orthogonal coupling layer 411 on the first shield 401. Orthogonal coupling layer 411 is formed from a material that provides orthogonal coupling between two ferromagnetic layers. Some exemplary materials used for orthogonal coupling layer 411 include PtMn, NiMn or other antiferromagnetic materials. Orthogonal coupling may be achieved across a thin layer of antiferromagnetic material. Thus, the thickness of orthogonal coupling layer 411 may be 25 Å or less.

MR sensor 403 further includes an SAF pinned structure on orthogonal coupling layer 411. The SAF pinned structure includes a first pinned layer 412, an antiparallel (AP) coupling layer 413, and a second pinned layer 414. First and second pinned layers 412 and 414 are formed from ferromagnetic materials, such as CoFe. AP coupling layer 413 is formed from a non-magnetic material, such as Ru. Although the term "layer" is used in singular font, a "layer" as described in this embodiment may be comprised of multiple layers of material.

MR sensor 403 further includes a spacer layer 415 on the second pinned layer 414. Spacer layer 415 is formed from a non-magnetic material, such as Cu. In some embodiments, spacer layer 415 may be comprised of MgO or a similar material. MR sensor 403 further includes a free layer 416 on spacer layer 415. Free layer 416 is formed from a ferromagnetic material, such as CoFe. MR sensor 403 further includes a cap layer 417. Cap layer 417 is used to protect the underlying layers from fabrication steps that are used to form read element 212. Cap layer 417 may have many different structures depending on design preferences.

First shield 401 has a magnetic moment that is substantially longitudinal (i.e., parallel to the ABS). The arrow in first shield 401 illustrates the longitudinal magnetic moment of first shield 401. Orthogonal coupling layer 411 has properties of providing orthogonal coupling between two ferromagnetic layers. As a result, the magnetic moment of first pinned layer 412 is orthogonally coupled to the magnetic moment of first shield 401 in a quiescent state (i.e., the magnetic moments are offset by 90 degrees). With the magnetic moment of first shield 401 being longitudinal, the coupling across orthogonal coupling layer 411 causes the magnetic moment to be substantially transverse (i.e., perpendicular to the ABS). The transverse magnetic moment of first pinned layer 412 is illustrated by a tail of an arrow.

Second pinned layer 414 is antiparallel coupled to first pinned layer 412 across AP coupling layer 413. As a result, the magnetic moment of second pinned layer 414 is antiparallel (but still transverse) to the magnetic moment of first pinned layer 412. The magnetic moment of second pinned layer 414 is illustrated by a head of an arrow.

Free layer 416 has a magnetic moment that is substantially longitudinal (i.e., parallel to the ABS). The arrow in free layer 416 illustrates the longitudinal magnetic moment of free layer 416. The magnetic moment of free layer 416 is free to rotate in response to magnetic fields from transitions on a magnetic disk that is proximate to MR sensor 403. The rotation of the magnetic moment of free layer 416 causes a change in resistance of MR sensor 403. When a sense current is injected through MR sensor 403, the resistance of MR sensor 403 may be determined to generate a read signal. Because read element 212 comprises a CPP element in this embodiment, first shield 401 and second shield 402 form leads for the sense current.

In a typical MR sensor, the magnetic moment of the AFM pinning layer is fixed. Thus, transitions on a magnetic disk do not change the magnetic moment of the AFM pinning layer. In this embodiment, the magnetic moment of first shield 401, which is acting as a pinning layer, is not fixed. The response of first shield 401 to a transition on the magnetic disk is similar to the response of free layer 416, where the magnetic moment rotates. It may appear that MR sensor 403 would only work if the response of first shield 401 is negligible compared to the response of free layer 416. The net read signal produced by an MR sensor is defined by the difference in magnetic angle between the reference and the free layer. Because the reference in MR sensor 403 is second pinned layer 414, which is tightly coupled to first shield 401, equal responses by first shield 401 and free layer 416 could cancel out the read signal.

Figure 5:
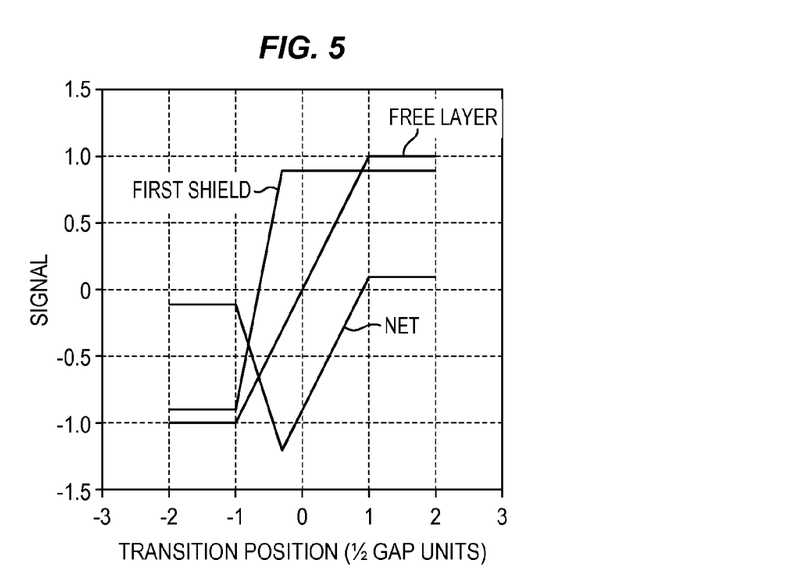
FIG. 5 is a graph illustrating the responses of a first shield and a free layer in an exemplary embodiment of the invention.

For the structure of MR sensor 403, the response of first shield 401 is comparable to that of free layer 416. Even though the responses are similar, MR sensor 403 works effectively because the rotations of the magnetic moments of first shield 401 and free layer 416 are not synchronous. FIG. 5 is a graph schematically illustrating the responses of first shield 401 and free layer 416 in an exemplary embodiment of the invention. The responses in FIG. 5 are due to a transition passing underneath read element 212. The gap (between −1 and 1) represents the distance between first shield 401 and second shield 402.

As is illustrated in FIG. 5, free layer 416 has a polarity change as the transition crosses the center of the gap (at position "0"). Responsive to the same transition, first shield 401 has a polarity change before the transition crosses the center of the gap. Consequently, the response of first shield 401 is not in phase with the response of free layer 416. FIG. 5 further shows the net read signal, which is the difference between the response of first shield 401 and the response of free layer 416. The net read signal is not cancelled out because the responses of first shield 401 and free layer 416 are out of phase. By being out of phase, the responses are actually additive, and the net read signal shows a high amplitude spike representing a detected transition on the magnetic disk. FIG. 5 shows that a high-amplitude net read signal may be produced by MR sensor 403.

Read element 212 provides advantages over prior read elements. Because read element 212 uses first shield 401 as a pinning layer, a conventional AFM pinning layer is not needed in MR sensor 403. A conventional AFM pinning layer may have a thickness of 60 Å or more, in addition to one or more seed layers that may be deposited along with the AFM pinning layer. By fabricating MR sensor 403 without an AFM pinning layer, the overall thickness of MR sensor 403 may be reduced, such as to thicknesses less than about 300 Å. Read element 212 may advantageously be used for higher density recording due to the lower thickness of MR sensor 403. Also, the AFM pinning layer has a high parasitic resistance, so removal of the AFM pinning layer as in MR sensor 403 allows for improved signal-to-noise ratio (SNR).

Figure 6:
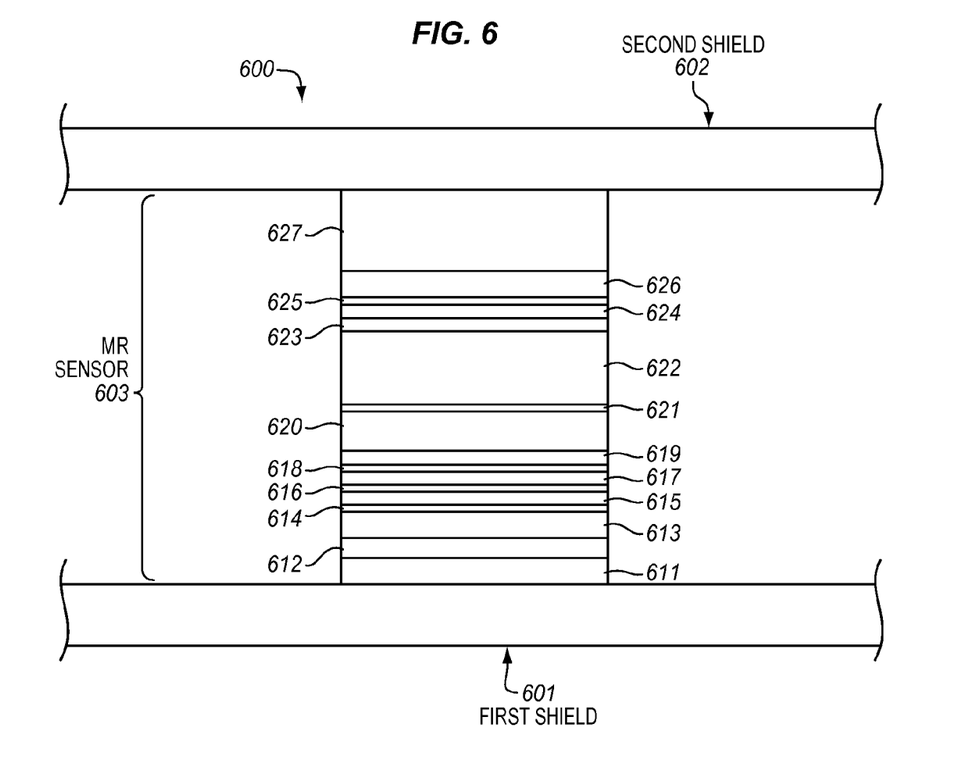
FIG. 6 illustrates a more detailed read element in an exemplary embodiment of the invention.

FIG. 6 illustrates a more detailed read element 600 in an exemplary embodiment of the invention. This embodiment is used to show exemplary materials and exemplary layer thicknesses of read element 600 where a shield forms an active portion of read element 600. This embodiment is in no way intended to limit the overall scope of the invention.

Read element 600 includes a first shield 601 and a second shield 602 that sandwich an MR sensor 603. MR sensor 603 is comprised of a plurality of thin-films that form the layers 611-627 of MR sensor 603. MR sensor 603 includes an orthogonal coupling layer 611. Orthogonal coupling layer 611 is comprised of PtMn and has a thickness of about 20 Å. MR sensor 603 further includes an SAF pinned layer structure. The SAF pinned layer structure includes a first pinned layer formed from a layer 612 of CoFe25 having a thickness of about 14 Å, and a layer 613 of Co having a thickness of about 21 Å. The SAF pinned layer structure further includes an AP coupling layer 614 comprised of Ru and having a thickness of about 5 Å. The SAF pinned layer structure further includes three alternating layers 615, 617, 619 of CoFe50 having thicknesses of 10 Å, 10 Å, and 8 Å, respectively. Layers 615, 617, and 619 are separated by layers 616, 618 of Cu having a thickness of about 4 Å.

MR sensor 603 further includes a spacer layer 620 on the SAF pinned layer structure. Spacer layer 620 is formed from Cu and has a thickness of about 30 Å. MR sensor 603 further includes a free layer structure on spacer layer 620. The free layer structure includes a layer 621 of CoFe50 having a thickness of about 5 Å, a layer 622 of CoMnGe having a thickness of about 53 Å, and a layer 623 of CoFe50 having a thickness of about 9 Å. MR sensor 603 further includes a cap layer structure on the free layer structure. The cap layer structure includes a layer 624 of Ru having a thickness of about 8 Å, a layer 625 of CoFe25 having a thickness of about 5 Å, a layer 626 of NiFe having a thickness of about 20 Å, and a layer 627 of Ru having a thickness of about 60 Å. Based on the thicknesses provided above, the total thickness of MR sensor 603 is about 286 Å.

As with read element 212 in FIG. 4, first shield 601 is an active portion of MR sensor 603. First shield 601 is orthogonally coupled to the layer 612 of the pinned layer structure across orthogonal coupling layer 611. Thus, first shield 601 acts as a pinning layer in MR sensor 603.

As a comparison to a conventional MR sensor, a conventional MR sensor typically includes an AFM pinning layer having a thickness of about 60 Å. In addition to the AFM pinning layer, the conventional MR sensor may include seed layers under the AFM pinning layer, such as a layer of Ta having a thickness of about 20 Å, and a layer of Ru having a thickness of about 25 Å. By using first shield 601 as a pinning layer in MR sensor 603, the AFM pinning layer (60 Å) and the seed layers (25 Å+20 Å) can be replaced with a thin orthogonal coupling layer (20 Å). Thus, MR sensor 603 may be fabricated substantially thinner than a conventional MR sensor.

Figure 7:
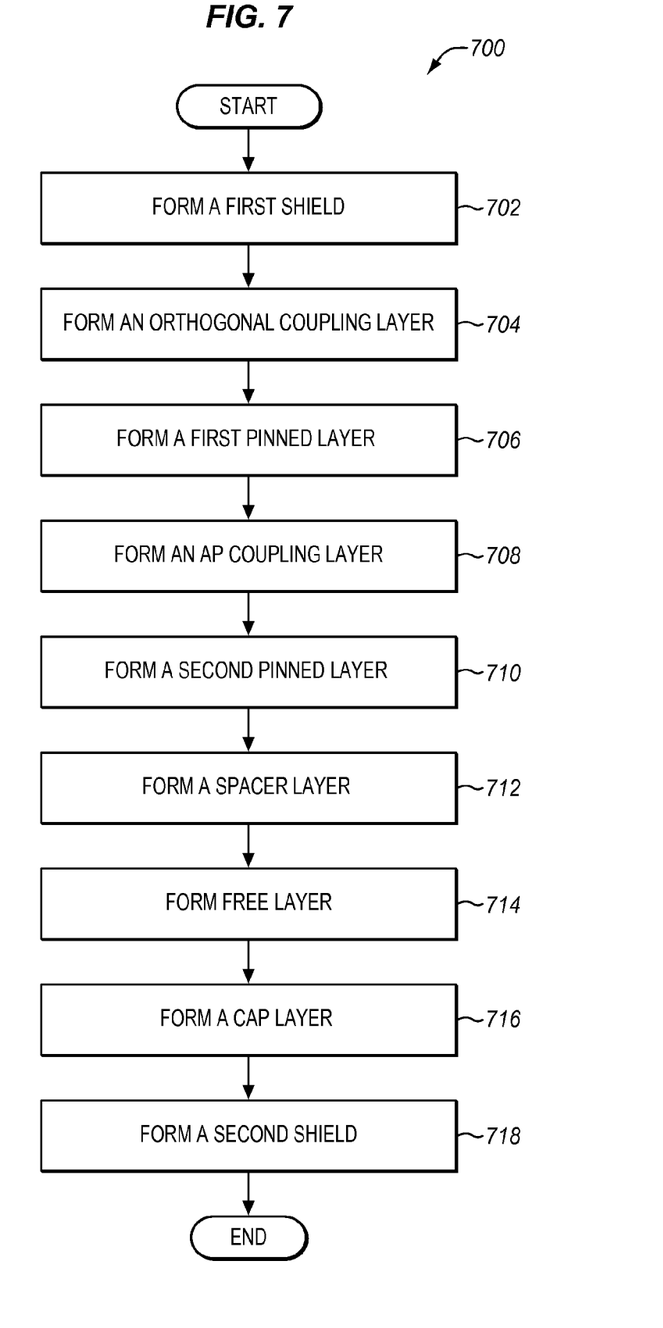
FIG. 7 is a flow chart illustrating a method of fabricating a read element in an exemplary embodiment of the invention.

FIG. 7 is a flow chart illustrating a method 700 of fabricating a read element in an exemplary embodiment of the invention. Method 700 may be used to fabricate read element 212 shown in FIG. 4 having an MR sensor sandwiched between two shields. The steps of the flow chart in FIG. 7 are not all inclusive and may include other steps not shown.

Step 702 comprises forming a first shield. The first shield may be formed by depositing a layer of NiFe. The top surface of the first shield may then be planarized. Step 704 comprises forming an orthogonal coupling layer on the first shield. The term "on" as used herein may refer to being formed directly on top of, or formed above in the stack. The orthogonal coupling layer may be formed by depositing a layer of PtMn or another type of antiferromagnetic material. Step 706 comprises forming a first pinned layer on the orthogonal coupling layer. The first pinned layer may be formed by depositing a layer of CoFe, NiFe, or multiple layers of ferromagnetic material. Step 708 comprises forming an AP coupling layer on the first pinned layer. The AP coupling layer may be formed by depositing a layer of Ru. Step 710 comprises forming a second pinned layer on the AP coupling layer. The second pinned layer may be formed by depositing a layer CoFe, or any suitable magnetic alloy like CoMnGe which optimizes the CPP GMR coefficient. In general multiple layers of ferromagnetic materials can be used. Optionally, one or more thin Cu layers may be inserted into the second pinned layer to enhance the CPP GMR coefficient.

Step 712 comprises forming a spacer layer on the second pinned layer. The spacer layer may be formed by depositing a layer of Cu or another type non-magnetic material. In some embodiments, the spacer layer may be formed by depositing a layer of non-conductive, non-magnetic material, such as MgO. Step 714 comprises forming a free layer on the spacer layer. The free layer may be formed by depositing a layer of CoFe, or any suitable magnetic alloy like CoMnGe which optimizes the CPP GMR coefficient. In general, multiple layers of ferromagnetic materials can be used in order to simultaneously optimize other magnetic properties such as coercivity. The free layer may also have a SAF structure in some embodiments. Step 716 comprises forming a cap layer on the free layer. The cap layer may be formed by depositing one or more layers of material used to protect the layers underneath.

When the above layers are formed, method 700 may include additional fabrication steps (not shown) that are used to define a stripe height and a track width of the MR sensor. The fabrication steps may also include depositing insulation material, depositing hard bias material, and depositing other layers. When the MR sensor has its desired shape and the side regions of the MR sensor are filled with the desired material, step 718 of method 700 comprises forming a second shield. The second shield may be formed by depositing a layer of NiFe.

The read element formed from method 700 has the first shield acting as a pinning layer as discussed in relation to read element 212 in FIG. 4. Thus, the read element has the advantages of a reduced thickness so that it may be used for high density recording. Although the first shield is indicated as an active portion the MR sensor in the above embodiments, those skilled in the art will appreciate that either one of the shields (the top or bottom) may be an active portion of the MR sensor.

Although specific embodiments were described herein, the scope of the invention is not limited to those specific embodiments. The scope of the invention is defined by the following claims and any equivalents thereof.

We claim:

1. A magnetoresistance (MR) read element, comprising:
   a first shield;
   an orthogonal coupling layer on the first shield;
   a first pinned layer on the orthogonal coupling layer having a magnetic moment orthogonally coupled to a magnetic moment of the first shield across the orthogonal coupling layer;
   an antiparallel coupling layer on the first pinned layer;
   a second pinned layer on the antiparallel coupling layer having a magnetic moment that is antiparallel coupled to the magnetic moment of the first pinned layer across the antiparallel coupling layer;
   a spacer layer on the second pinned layer; and
   a free layer on the second spacer layer.

2. The MR read element of claim 1 further comprising:
   a cap layer on the free layer; and
   a second shield on the cap layer.

3. The MR read element of claim 1 wherein the orthogonal coupling layer is formed from an antiferromagnetic material.

4. The MR read element of claim 1 wherein the magnetic moment of the first shield is longitudinal and the magnetic moment of the first pinned layer is transverse in a quiescent state due to the orthogonal coupling across the orthogonal coupling layer.

5. The MR read element of claim 1 wherein a thickness of the orthogonal coupling layer is less than about 25 Å.

6. A magnetic disk drive system, comprising:
   a magnetic disk; and
   a recording head that includes a magnetoresistance (MR) read element for reading data from the magnetic disk, the MR read element comprising:
   a first shield;
   an orthogonal coupling layer on the first shield;
   a first pinned layer on the orthogonal coupling layer having a magnetic moment orthogonally coupled to a magnetic moment of the first shield across the orthogonal coupling layer;
   an antiparallel coupling layer on the first pinned layer;
   a second pinned layer on the antiparallel coupling layer having a magnetic moment that is antiparallel coupled to the magnetic moment of the first pinned layer across the antiparallel coupling layer;
   a spacer layer on the second pinned layer;
   a free layer on the spacer layer;
   a cap layer on the free layer; and
   a second shield on the cap layer.

7. The magnetic disk drive system of claim 6 wherein the orthogonal coupling layer is formed from an antiferromagnetic material.

8. The magnetic disk drive system of claim 6 wherein the magnetic moment of the first shield is longitudinal and the magnetic moment of the first pinned layer is transverse in a quiescent state due to the orthogonal coupling across the orthogonal coupling layer.

9. The magnetic disk drive system of claim 6 wherein a thickness of the orthogonal coupling layer is less than about 25 Å.

10. A read element, comprising:
    a first shield;
    a second shield; and
    a magnetoresistance (MR) sensor formed between the first shield and the second shield;

wherein the first shield acts as a pinning layer for the MR sensor;

wherein the MR sensor includes:

a pinned layer; and an orthogonal coupling layer formed between the first shield and the pinned layer;

wherein the orthogonal coupling layer provides orthogonal coupling between the first shield and the pinned layer.

11. The read element of claim 10 wherein the orthogonal coupling layer is formed from an antiferromagnetic material.

12. The read element of claim 10 wherein a magnetic moment of the first shield is longitudinal and a magnetic moment of the pinned layer is transverse in a quiescent state due to the orthogonal coupling across the orthogonal coupling layer.

13. The read element of claim 10 wherein a thickness of the orthogonal coupling layer is less than about 25 Å.

14. The read element of claim 10 wherein the MR sensor does not include an antiferromagnetic pinning layer that has a fixed magnetic moment.

* * * * *

UNITED STATES PATENT AND TRADEMARK OFFICE
CERTIFICATE OF CORRECTION

PATENT NO. : 8,305,715 B2  Page 1 of 1
APPLICATION NO. : 11/965532
DATED : November 6, 2012
INVENTOR(S) : Mauri et al.

It is certified that error appears in the above-identified patent and that said Letters Patent is hereby corrected as shown below:

In column 4 line 50, the text "the term "layer" is used in singular font," should read --the term "layer" is used in singular form,--

Signed and Sealed this
Twenty-fifth Day of December, 2012

David J. Kappos
*Director of the United States Patent and Trademark Office*